(12) United States Patent
Castillejo

(10) Patent No.: US 6,982,463 B2
(45) Date of Patent: Jan. 3, 2006

(54) INTEGRATED CIRCUIT WITH REDUCED COUPLING VIA THE SUBSTRATE

(75) Inventor: Armand Castillejo, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/450,009

(22) PCT Filed: Nov. 26, 2001

(86) PCT No.: PCT/FR01/03721

§ 371 (c)(1),
(2), (4) Date: Dec. 30, 2003

(87) PCT Pub. No.: WO02/47164

PCT Pub. Date: Jun. 13, 2002

(65) Prior Publication Data

US 2004/0085704 A1   May 6, 2004

(30) Foreign Application Priority Data

Dec. 6, 2000   (FR) .................................. 00 15789

(51) Int. Cl.
   *H01L 23/62*   (2006.01)
(52) U.S. Cl. ..................... 257/355; 257/356; 257/357
(58) Field of Classification Search ........ 275/355–357, 275/605, 127, 170, 409, 452, E29.012, 728, 275/288, 484; 438/140
See application file for complete search history.

(56) References Cited

U.S. PATENT DOCUMENTS

| | | | | |
|---|---|---|---|---|
| 4,757,363 A * | 7/1988 | Bohm et al. | ................ | 257/358 |
| 4,988,636 A * | 1/1991 | Masleid et al. | ............. | 438/129 |
| 5,629,545 A * | 5/1997 | Leach | ........................ | 257/362 |
| 5,767,538 A * | 6/1998 | Mullins et al. | ............. | 257/115 |
| 5,826,628 A * | 10/1998 | Hamilton | ..................... | 140/105 |
| 5,838,050 A * | 11/1998 | Ker et al. | ................... | 257/401 |
| 6,008,532 A * | 12/1999 | Carichner | ................... | 257/691 |
| 6,078,068 A * | 6/2000 | Tamura | ...................... | 257/203 |
| 6,097,066 A * | 8/2000 | Lee et al. | ................... | 257/355 |
| 6,211,554 B1 * | 4/2001 | Whitney | ..................... | 257/355 |
| 6,215,157 B1 * | 4/2001 | Fukuda | ....................... | 257/362 |
| 6,249,413 B1 * | 6/2001 | Duvvury | ..................... | 361/111 |
| 6,268,778 B1 * | 7/2001 | Mucke et al. | ........... | 331/117 R |
| 6,274,909 B1 * | 8/2001 | Chang et al. | ............... | 257/355 |
| 6,479,869 B1 * | 11/2002 | Hiraga | ........................ | 257/350 |
| 6,537,849 B1 * | 3/2003 | Tsai et al. | ................... | 438/106 |
| 6,735,755 B2 * | 5/2004 | Shau | ........................... | 716/16 |
| 2004/0217477 A1 * | 11/2004 | Tsai et al. | ................... | 257/758 |

* cited by examiner

*Primary Examiner*—Long Pham
*Assistant Examiner*—Thao X. Le
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The integrated circuit includes a substrate SB incorporating a plurality of electronic components C1, C2 and a seal ring SR around the electronic components. It includes cold spot means VM, PG, BDG disposed between the electronic components and the seal ring. It further includes electrostatic discharge protection means including an electrostatic discharge rail VM around the electronic components and constituting said cold spot means.

17 Claims, 2 Drawing Sheets

INTEGRATED CIRCUIT WITH REDUCED COUPLING VIA THE SUBSTRATE

CROSS REFERENCE TO RELATED APPLICATIONS

This application is based upon and claims priority from prior French Patent Application No. 0015789, filed Dec. 6, 2000, the disclosure of which is hereby incorporated by reference in its entirety.

BACKGROUND OF THE INVENTION

1. Field of the Invention

The invention generally relates to integrated circuits and more particularly to radio-frequency integrated circuits designed to operate at frequencies of 1 GHz and above.

2. Description of Related Art

Radio-frequency integrated circuits include various functional units within the same substrate, for example low-noise amplifiers (LNA), local oscillators, power amplifiers and phase-locked loops.

One of the major problems to be solved in designing radio-frequency circuits is to minimize the risk of coupling between the various units. This is because any coupling from one unit to another can cause a malfunction of the integrated circuit, as in the case of coupling between a low-noise amplifier of a receive channel and a power amplifier of a send channel, for example. This is because coupling is then created between the input and the output of the circuit, which causes a malfunction of the circuit.

There are currently many causes of coupling between units. For example, coupling between units can result from interconnection problems or from design errors in the layout of the electronic components. Coupling can also occur via the silicon substrate of the integrated circuit.

The silicon substrate is inherently conductive. The various grounds of the integrated circuits are therefore connected via the resistance of the substrate.

To minimize, or even eliminate, coupling between units via the substrate, it has already been proposed to place insulative walls in the substrate between the various functional units.

However, there is another problem, previously unidentified, and which is also the cause of coupling between the various functional units of an integrated circuit via the substrate.

This problem lies in the presence of a seal ring around the electronic components of the integrated circuit, which is inherent to the technology.

The seal ring prevents pollution of the integrated circuit by polluting particles resulting from cutting the semiconductor wafer along cutting paths delimiting the various integrated circuits of the wafer.

The seal ring is in fact a wall made up of all the layers available in the integrated circuit as well as a caisson formed in the substrate, for example a $P^+$-type caisson.

Because of its nature, and because it has a higher conductivity, the seal ring constitutes a low-impedance path. Consequently, if an interfering signal is emitted into the substrate by a functional unit located near the seal ring, that interference signal will naturally take the low-impedance path consisting of the seal ring and propagate along the ring, possibly until it creates unwanted coupling with another functional unit in another part of the integrated circuit and also beside the seal ring.

Accordingly, a need exists to overcome the problems in the prior art and to provide a integrated circuit with reduced coupling.

SUMMARY OF THE INVENTION

Briefly, in according with the present invention an integrated circuit with means forming a cold spot formed between the electronic components of the integrated circuit and the seal ring.

In this regard, the invention proposes providing the integrated circuit with means forming a cold spot between the electronic components of the integrated circuit and the seal ring.

As the skilled person is well aware, cold spot means consist of a path of minimum impedance, enabling unwanted signals or charges to be evacuated via the cold spot means, and consequently preventing unwanted signals or charges flowing in the seal ring to interfere with the operation of another functional unit of the integrated circuit.

Another constraint in the manufacture of integrated circuits is the need to provide them with means to protect them against electrostatic discharges that could otherwise damage the electronic components of the integrated circuit.

The means providing protection against electrostatic discharges conventionally consist of a plurality of discharge rails (metallization) connected to the respective functional units and in particular having common ground terminals.

These means also include devices formed by diodes and bipolar transistors for circulating electrostatic charges from one terminal of the integrated circuit to another, preventing them passing through the various functional units.

In one particularly advantageous embodiment of the invention, and subject to a structural modification, the electrostatic discharge protection means constitute said cold spot means. To be more precise, in accordance with the invention, the electrostatic discharge protection means include at least one electrostatic discharge rail surrounding the electronic components and forming the cold spot means.

In one embodiment of the invention, the electrostatic protection rail is connected to an external ground terminal via connecting means and the impedance of the rail and the connecting means is lower than that of the seal ring. Also, the discharge rail has no direct connection to the bulk substrate of any component.

The invention therefore adopts a "monorail" strategy to electrostatic discharge protection, the "monorail" strategy solving the problem of coupling via the substrate and the seal ring by forming the cold spot means.

Because in some configurations or types of package, the connecting means consist of electrical wires (bonding wires) having non-negligible inductance, the connecting means advantageously include a plurality of electrical wires (bonding wires), for example at least four and advantageously about ten, in particular if the BGA, TQFP or QFN form of package is used.

The invention also proposes a method of minimizing the coupling via the substrate between various electronic components of a radio-frequency integrated circuit, including the installation of a cold spot means between the electronic components and a seal ring surrounding the electronic components.

The cold spot means are advantageously produced with an electrostatic discharge rail surrounding the electronic components.

According to a mode of implementation in which at least some of the electronic components have bulk substrates, the electrostatic protection rail is connected to an external ground terminal by connecting means. The impedance of the rail and the connecting means is less than that of the seal ring, and the discharge rail is made to have no direct connection with the bulk substrate of any component.

The invention also proposes a use of a cold spot means disposed between the electronic components of a radio-frequency integrated circuit and a seal ring surrounding the electronic components, so as to minimize the coupling via the substrate between these various electronic components.

Other advantages and features of the invention will become apparent on reading the following detailed description of one non-limiting embodiment and from the accompanying drawings, in which:

FIGS. 1 and 2 show a radio-frequency integrated circuit CI after it has been cut from a semiconductor wafer by cutting along cutting lines.

Figure 2:
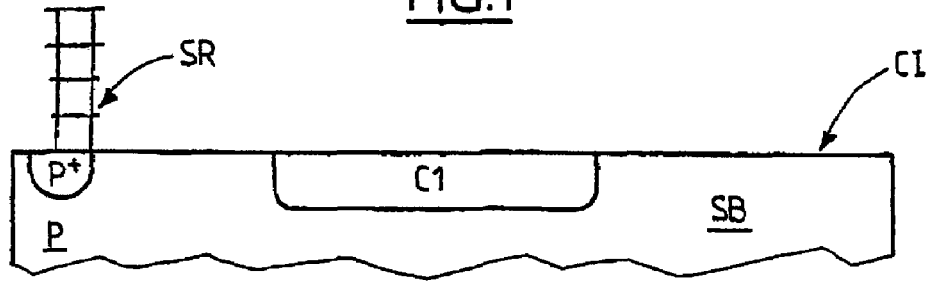
FIG. 2 is a diagram showing a seal ring more specifically and from another point of view.

The integrated circuit is formed in a substrate SB, for example a P-type substrate. It has at its periphery a seal ring SR. As shown in FIG. 2 in particular, which shows the integrated circuit partly in section, the seal ring conventionally comprises a $P^+$-type caisson and a stack of all the layers of the integrated circuit.

The seal ring therefore forms a wall around the electronic components of the integrated circuit to prevent any pollution when cutting the integrated circuit CI away from the semiconductor wafer.

For simplicity, it is assumed here that the integrated circuit includes electronic components forming two separate functional units (cores) C1 and C2. For example, the unit C1 can provide a low-noise amplifier (LNA) function and the unit C2 a power amplifier function.

As is conventional in the art, and as the skilled person is well aware, it is particularly advantageous to provide between the functional units C1 and C2 an isolating wall for mutually isolating the two functional units from unwanted signals that could pass from one functional unit to another via the substrate SB. This kind of isolating wall is formed by a $P^+$-doped caisson, for example, connected to ground.

Unwanted signals can also propagate in the substrate from the unit C1, for example, toward the periphery of the integrated circuit, i.e. toward the seal ring SR.

The general feature of the invention then consists of disposing between the electronic components and the seal ring SR cold spot means, i.e. means for collecting unwanted signals and evacuating them to an external ground, in order to prevent any coupling with the other electronic components, for example the unit C2. With no such cold spot means, unwanted signals from the unit C1, for example, and propagating toward the seal ring would then flow in the seal ring, which constitutes a low-impedance path, in particular because of the presence of the $P^+$ caisson. The unwanted signal would then propagate via the seal ring and could reach the bulk substrate of the components of the functional unit C2, with the risk of causing malfunctions.

Here the cold spot means advantageously take the form of an electrostatic discharge rail VM around the electronic components and forming part of electrostatic discharge protection means.

The skilled person knows that an integrated circuit is usually provided with protection means against electrostatic discharges that can occur between two leads of the package, for example if the package is picked up by hand or by a placement machine.

The electrostatic discharge protection means usually include the same number of rails as there are functional units in the integrated circuit (this is known as a "multirail" strategy). Also, the ground terminals of the functional unit are common to the ground terminal of the corresponding electrostatic discharge rail.

The invention proposes a totally different electrostatic discharge protection strategy which provides efficient protection against electrostatic discharge and additionally provides the cold spot means.

In this regard, the electrostatic discharge protection strategy is a "monorail" strategy, that is to say a strategy using a single electrostatic discharge rail VM connected to an external ground terminal by connecting means, the discharge rail having no direct connection to the bulk substrate of any component.

In addition to the rail VM, the electrostatic discharge protection means include another rail VP parallel to the rail VM and which also surrounds the electronic components of the integrated circuit. The rail VP is not connected to ground.

The connections by electrical connecting wires ("bonding wires") between the terminals of certain components and the leads of the package encapsulating the integrated circuit are all connected to the rail VM via the diodes D1 and to the rail VP via the diodes D2. To be more precise, the anode of a diode D1 is connected to the rail VM and the cathode of a diode D2 is connected to the rail VP.

The electrostatic discharge protection means further include a circuit CLM known in the art and conventionally comprising diodes and bipolar transistors, for example, for detecting electrostatic discharge pulses and enabling them to pass from one rail to the other. The circuit CLM is known to the skilled person as a "clamp".

Figure 1:
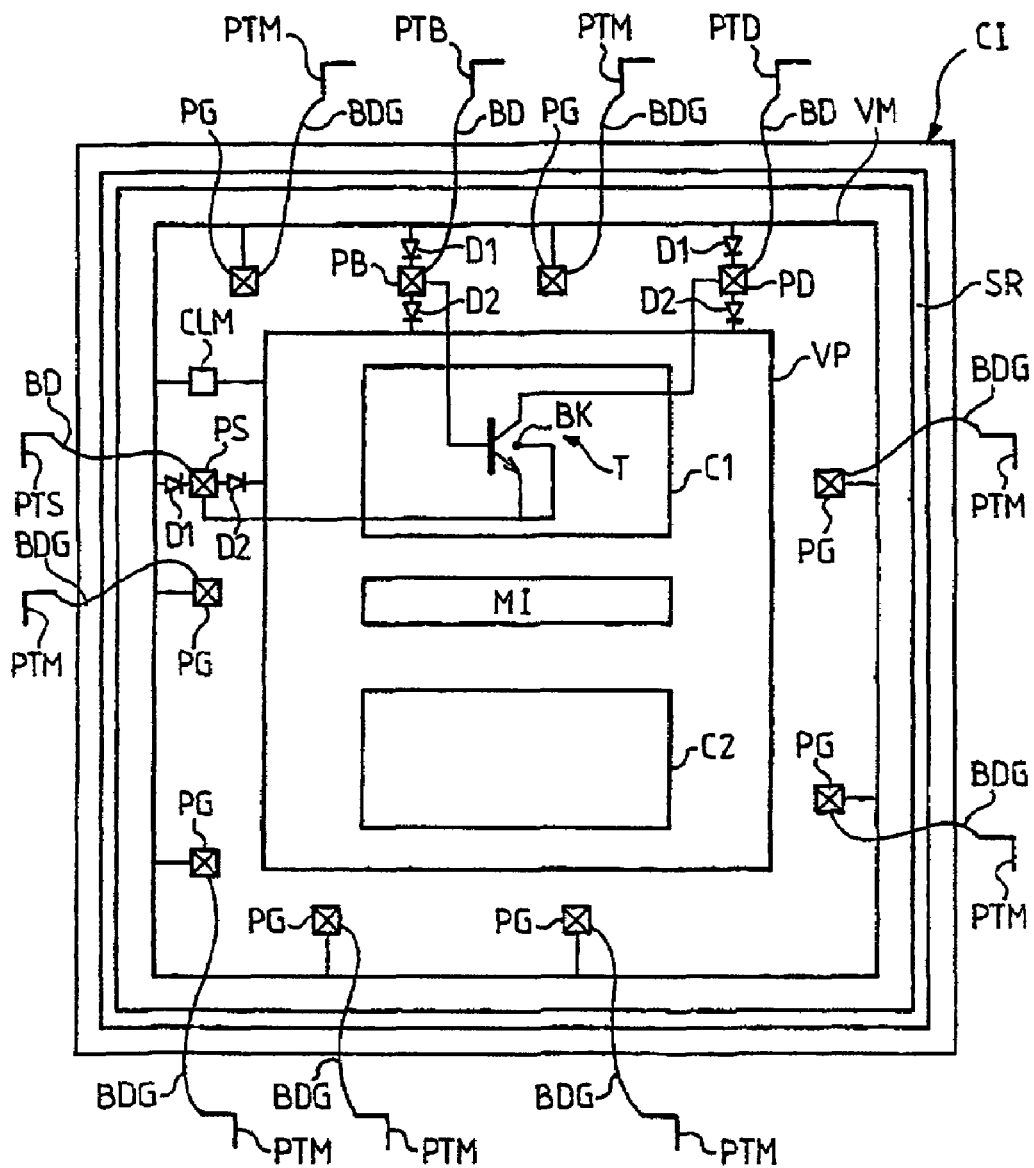
FIG. 1 is a highly diagrammatic illustration of one embodiment of an integrated circuit according to the invention.

For simplicity, the example shown in FIG. 1 includes a single electronic component in the unit C1, for example a bipolar transistor T. The base of the bipolar transistor is connected to the terminal PB and to a metal pin PTB of the package by a connection (bonding wire) BD. The drain of the transistor is connected to a terminal PD in turn connected to a pin PTD of the package via a wire BD.

The source of the transistor T is connected to a terminal PS in turn connected to a pin PTS of the package via a wire BD. Finally, the bulk substrate BK of the transistor is also connected to the terminal PS.

If an electrostatic discharge occurs between the pin PTB and the pin PTS, for example, during handling of the package containing the integrated circuits, and assuming that this discharge takes the form of a positive pulse, it travels from the terminal PB toward the rail VP via the diode D2, and then follows the circuit CLM, traveling along the rail VM and leaving via the pin PTS, the diode D1 and the terminal PS.

A negative pulse takes the rail VM from the terminal PB, via the diode D1, and then the circuit CLM, the rail VP, and the diode D2, before it leaves via the terminal PS.

Of course, the skilled person knows that the diodes D1 and D2 constitute paths of minimum impedance relative to the connections between the terminals and the component itself. The connections incorporate resistances (for example the base resistance or the source resistance) which have higher impedances. It is also conventional to dispose other diodes (not shown here) between the components and the terminals PB and PS, for example, to guarantee that the diodes D1 and D2 constitute a minimum impedance path. This is well known to the skilled person.

For the rail VM to form a cold spot, the impedance of the rail and the connecting means that connect it to an external ground terminal must be lower than the impedance of the seal ring SR. The skilled person knows that the connecting wires (bonding wires) connecting the terminals of the integrated circuit to the external metal pins of the package have an inductive impedance. For this reason it is preferable to have a plurality of terminals PG connected to the rail VM, with each terminal connected by an electrical connecting wire BDG to a pin PTM of the package; all the pins PTM can be connected to an external ground when the integrated circuit is operating.

By providing several parallel BDG connecting wires, it is possible to minimize, or even eliminate, the unwanted inductance inherent to the connecting wires, which is particularly important for radio-frequency applications, thus making it possible to provide a cold spot means in terms of radio-frequency.

The skilled person knows how to adjust the number of terminals PG necessary to achieve a cold spot (path of minimum impedance). A number of the order of ten is chosen, for example, for thin quad flat packs (TQFP).

Thus in operation, if an unwanted signal flows from the unit C1 via the substrate toward the seal ring, it takes the preferred path consisting of the rail VM and is evacuated to ground via the pins PTM.

Note that, unlike the prior art, the electrostatic discharge rail VM has no direct connection to the bulk substrate of any electronic component of the integrated circuit. This is because the terminal PS is here connected to the rail VM via the diode D1. Accordingly, the distance between the source of an unwanted signal (the transistor T, for example) and the seal ring SR is greatly increased relative to a prior art structure. This is because, in the prior art, because there is a direct connection between the bulk substrate BK and the terminal PS which constitutes both the ground terminal of the transistor and the ground terminal of the rail, an unwanted pulse emitted into the substrate by the transistor T is directly at the level of the terminal PS, and therefore very close to the seal rail.

Figure 3:
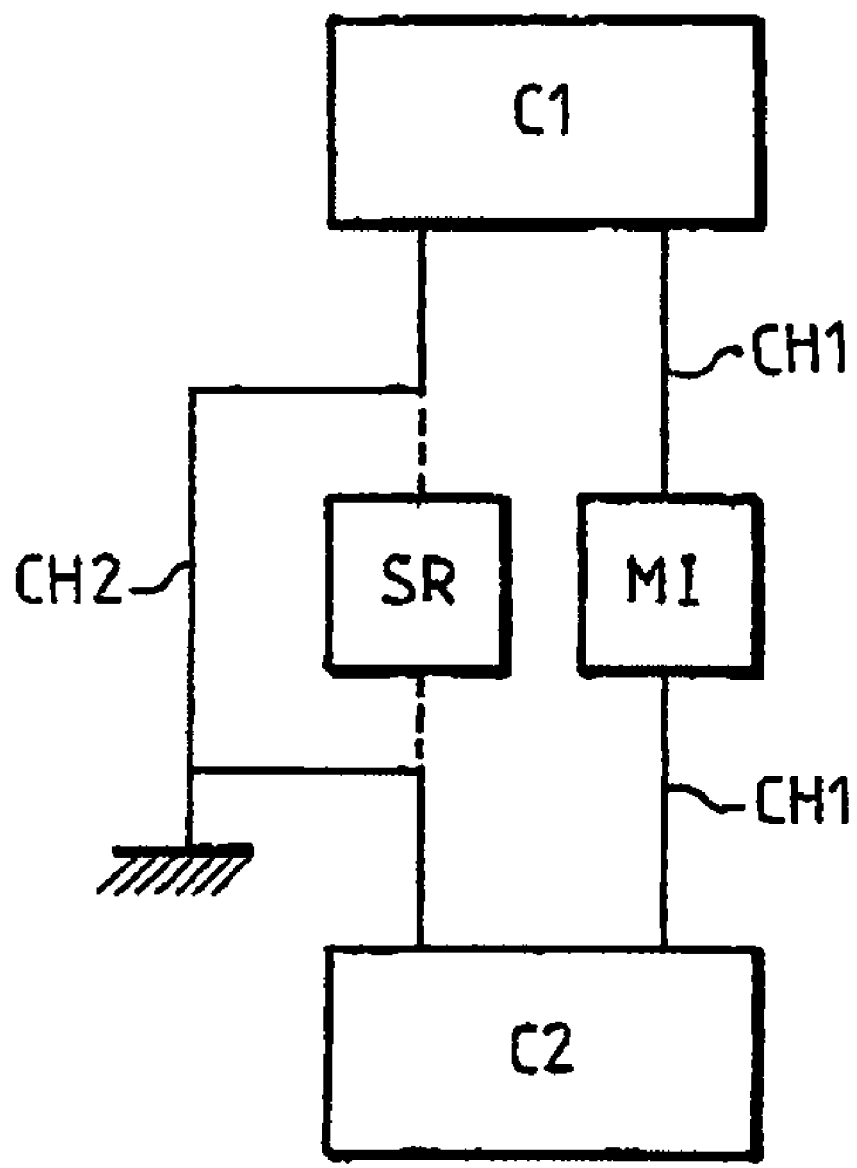
FIG. 3 is a highly diagrammatic illustration of one effect of the invention.

FIG. 3 shows the advantages of the invention. FIG. 3 shows a path CH1 that can be taken by an unwanted signal emanating from either functional unit C1 or C2. It can be seen that this path is interrupted by the isolating wall MI. However, in the prior art, an unwanted signal could equally short circuit the isolating wall and travel via the seal ring SR, causing unwanted coupling via the substrate.

In accordance with the invention, on the other hand, the cold spot means between the functional units C1 and C2 and the seal ring SR form a minimum impedance path CH2 that evacuates an unwanted signal to ground instead of causing it to travel through the seal ring SR. This eliminates the unwanted coupling.

What is claimed is:

1. An integrated radio frequency circuit with reduced coupling a plurality of electronic components formed thereon, the integrated circuit comprising:
   a substrate;
   a plurality of electronic components disposed on the substrate;
   a seal ring with an impedance, the seal ring disposed on the substrate to completely surround the plurality of electronic components so as to prevent an exposure of the plurality of electronic components to particulate contamination resulting from a subsequent cutting of the substrate to form an integrated circuit;
   at least one cold spot including a first discharge rail disposed on the substrate in between the plurality of electronic components and the seal ring, the cold spot formed and connected to ground so as to provide a path of lower impedance than the impedance of the seal ring thereby directing unwanted signals away from the seal ring and into the discharge rail of the cold spot thereby avoiding coupling of the unwanted signals between the plurality of electronic circuits via the substrate; and
   a second discharge rail disposed on the substrate in between the plurality of electronic components and the first discharge rail, wherein the first discharge rail and the second discharge rail are electrically coupled by a clamp circuit for detecting electrostatic discharge signals and passing them between the first discharge rail and the second discharge rail.

2. The integrated circuit according to claim 1, wherein the first discharge rail is not directly coupled to a bulk substrate upon which the one or more of the plurality of electronic components is formed.

3. The integrated circuit according to claim 1, further comprising:
   one or more discharge terminals connected to the discharge rail via a bonding wire.

4. The integrated circuit according to claim 3, further comprising:
   one or more pins external to the substrate which are electrically coupled to the discharge rail.

5. The integrated circuit according to claim 4, wherein at least one of the pins is coupled to a ground potential so as to evacuate any signal on the discharge rail to the ground potential.

6. The integrated circuit according to claim 3, wherein the integrated circuit is packaged as a thin quad flat pack (TQFP) and the number of discharge terminals is ten or more.

7. The integrated circuit according to claim 2, further comprising:
   an electrostatic discharge rail disposed in between the one or more of the plurality of electronic components and the discharge rail so as to surround at least part of the one or more of the plurality of electronic components.

8. The integrated circuit according to claim 7, further comprising:
   one or more component terminals coupled by at least one diode to the discharge rail thereby providing a path for static discharge.

9. An integrated radio frequency circuit with reduced coupling a plurality of electronic components formed thereon, the integrated circuit comprising:
   a substrate with a plurality of electronic components disposed thereon;
   a seal ring with an impedance, the seal ring disposed on the substrate so as to completely surround the plurality of electronic components so as to prevent the exposure of the plurality of electronic components to particulate contamination resulting from a subsequent cutting of the substrate to form an integrated circuit;
   a first discharge rail disposed on the substrate in between the plurality of electronic components and the seal ring, the first discharge rail connected to ground and provides a path of lower impedance than the impedance of the seal ring thereby directing unwanted signals away from the seal ring and into the discharge rail thereby avoiding coupling of the unwanted signals between the plurality of electronic circuits via the substrate; and a second discharge rail disposed on the substrate in between the plurality of electronic components and the first discharge rail, wherein the first discharge rail and the second discharge rail are electrically coupled by a clamp circuit for detecting electrostatic discharge signals and passing them between the first discharge rail and the second discharge rail.

10. The integrated circuit according to claim 9, wherein the first discharge rail is not directly coupled to a bulk substrate upon which the one or more of the plurality of electronic components is formed.

11. The integrated circuit according to claim 9, further comprising:

one or more discharge terminals connected to the discharge rail via a bonding wire.

12. The integrated circuit according to claim 11, further comprising:

one or more pins external to the substrate which are electrically coupled to the discharge rail.

13. The integrated circuit according to claim 12, wherein at least one of the pins is coupled to a ground potential so as to evacuate any signal on the discharge rail to the ground potential.

14. The integrated circuit according to claim 11, wherein the integrated circuit is packaged as a thin quad flat pack (TQFP) and the number of discharge terminals is ten or more.

15. The integrated circuit according to claim 10, further comprising:

an electrostatic discharge rail disposed in between the one or more of the plurality of electronic components and the discharge rail so as to surround at least part of the one or more of the plurality of electronic components.

16. The integrated circuit according to claim 15, further comprising:

one or more component terminals coupled by at least one diode to the discharge rail thereby providing a path for static discharge.

17. The integrated circuit according to claim 9, wherein the plurality of electronic components includes at least one of a power amplifier, a local oscillator and a phase-locked loop.

* * * * *